United States Patent
Pradeep et al.

(10) Patent No.: US 6,461,887 B1
(45) Date of Patent: Oct. 8, 2002

(54) METHOD TO FORM AN INVERTED STAIRCASE STI STRUCTURE BY ETCH-DEPOSITION-ETCH AND SELECTIVE EPITAXIAL GROWTH

(75) Inventors: Yelehanka Ramachandramurthy Pradeep; Jia Zhen Zheng, both of Singapore (SG); Lap Chan, San Francisco, CA (US); Elgin Quek, Singapore (SG); Ravi Sundaresan, San Jose, CA (US); Yang Pan; James Yong Meng Lee, both of Singapore (SG); Ying Keung Leung, Aberdeen (HK)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/038,391

(22) Filed: Jan. 3, 2002

(51) Int. Cl.[7] .......................... H01L 21/00; H01L 21/76
(52) U.S. Cl. ........................ 438/43; 438/432; 438/442; 438/637; 438/701
(58) Field of Search ........................... 438/42, 43, 430, 438/432, 442, 637, 640, 700, 701

(56) References Cited

U.S. PATENT DOCUMENTS

| | | | | |
|---|---|---|---|---|
| 4,495,025 A | * | 1/1985 | Haskell ...................... | 156/648 |
| 4,886,763 A | | 12/1989 | Suzuki ........................ | 437/61 |
| 4,900,692 A | | 2/1990 | Robinson ..................... | 437/67 |
| 5,212,110 A | | 5/1993 | Pfiester et al. ................ | 437/67 |
| 5,298,450 A | * | 3/1994 | Verret ........................ | 438/207 |
| 5,663,091 A | * | 9/1997 | Yen et al. .................... | 437/60 |
| 5,681,776 A | | 10/1997 | Hebert et al. ................. | 437/72 |
| 5,773,351 A | | 6/1998 | Choi .......................... | 438/429 |
| 5,854,140 A | * | 12/1998 | Jaso et al. ................... | 438/740 |
| 5,869,395 A | * | 2/1999 | Yim .......................... | 438/637 |
| 5,926,732 A | * | 7/1999 | Matsuura ..................... | 438/622 |
| 5,940,731 A | * | 8/1999 | Wu ........................... | 438/640 |
| 6,017,817 A | * | 1/2000 | Chung et al. ................. | 438/637 |
| 6,171,967 B1 | * | 1/2001 | Jun ........................... | 438/700 |
| 6,207,532 B1 | * | 3/2001 | Lin et al. .................... | 438/424 |

* cited by examiner

Primary Examiner—Olik Chaudhuri
Assistant Examiner—David S Blum
(74) Attorney, Agent, or Firm—George O. Saile; Rosemary L. S. Pike; Stephen G. Stanton

(57) ABSTRACT

A method of forming an inverted staircase shaped STI structure comprising the following steps. A semiconductor substrate having an overlying oxide layer is provided. The substrate having at least a pair of active areas defining an STI region therebetween. The oxide layer is etched a first time within the active areas to form first step trenches. The first step trenches having exposed sidewalls. Continuous side wall spacers are formed on said exposed first step trench sidewalls. The oxide layer is etched X+1 more successive times using the previously formed step side wall spacers as masks to form successive step trenches within the active areas. Each of the successive step trenches having exposed sidewalls and have side wall spacers successively formed on the successive step trench exposed sidewalls. The oxide layer is etched a final time using the previously formed step side wall spacers as masks to form final step trenches exposing the substrate within the active areas. The STI region comprising an inverted staircase shaped STI structure. The step side wall spacers are removed from the X+2 step trenches. A planarized active area silicon structure is formed within the X+2 and final step trenches.

21 Claims, 4 Drawing Sheets

METHOD TO FORM AN INVERTED STAIRCASE STI STRUCTURE BY ETCH-DEPOSITION-ETCH AND SELECTIVE EPITAXIAL GROWTH

FIELD OF THE INVENTION

The present invention relates generally to forming isolation structures in semiconductor devices, and more specifically to methods forming shallow trench isolation regions (STI) in semiconductor devices.

BACKGROUND OF THE INVENTION

Latchup has been a concern for most of the complementary metaloxide semiconductor (CMOS) technologies. Latchup is a parasitic circuit effect, the result of which is the shorting of the VDD and Vss lines that usually results in chip self-destruction or at least system failure with the requirement to power down. Latchup effects will become severe when the VLSI circuit dimension is scaled. There are currently various ways to improve the latchup immunity by transistor design.

U.S. Pat. No. 5,681,776 to Hebert et al. describes selective epitaxial growth (SEG) active areas formed on an opening in an oxide layer.

U.S. Pat. No. 4,900,692 to Robinson describes epitaxial silicon (epi) active areas in a trench.

U.S. Pat. No. 5,212,110 to Pfiester et al. describes an epi active growth area.

U.S. Pat. No. 5,773,351 to Choi describes an SEG active area formed on an opening in an insulation layer.

U.S. Pat. No. 4,886,763 to Suzuki describes a process for forming EPI active areas between isolation areas.

SUMMARY OF THE INVENTION

Accordingly, it is an object of the present invention to provide a method of reducing latchup effect in adjacent semiconductor devices.

Another object of the present invention to provide a method of reducing latchup effect in adjacent semiconductor devices by increasing the distance between the $n^+$S/D area of one semiconductor device to the $p^+$S/D area of an adjacent semiconductor device.

Another object of the present invention to provide a method of reducing latchup effect in adjacent semiconductor devices by increasing the distance between the $n^+$S/D area of one NMOS semiconductor device, for example, to the $p^+$S/D area of an adjacent PMOS semiconductor device, for example, without sacrificing the isolation and the real estate.

Other objects will appear hereinafter.

It has now been discovered that the above and other objects of the present invention may be accomplished in the following manner. Specifically, a semiconductor substrate having an overlying oxide layer is provided. The substrate having at least a pair of active areas defining an STI region therebetween. The oxide layer is etched a first time within the active areas to form first step trenches. The first step trenches having exposed sidewalls. Continuous side wall spacers are formed on said exposed first step trench sidewalls. The oxide layer is etched X+1 more successive times using the previously formed step side wall spacers as masks to form successive step trenches within the active areas. Each of the successive step trenches having exposed sidewalls and have side wall spacers successively formed on the successive step trench exposed sidewalls. The oxide layer is etched a final time using the previously formed step side wall spacers as masks to form final step trenches exposing the substrate within the active areas. The STI region comprising an inverted staircase shaped STI structure. The step side wall spacers are removed from the X+2 step trenches. A planarized active area silicon structure is formed within the X+2 and final step trenches.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Definition of Active Areas 16/STI 20

Figure 1:
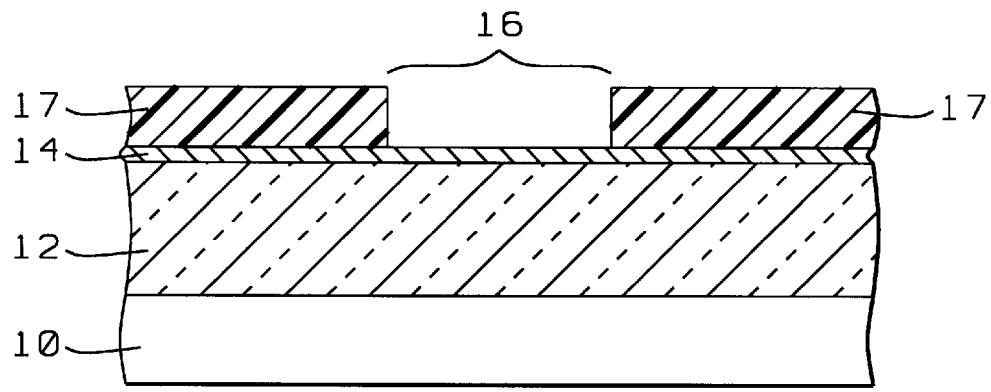
FIGS. 1 to 10 schematically illustrate in cross-sectional representation a preferred embodiment of the present invention.

Accordingly as shown in FIG. 1, starting semiconductor substrate 10 may be a silicon substrate.

Oxide ($SiO_2$) layer 12 is formed over substrate 10 to a thickness of preferably from about 1000 to 8000 Å, and more preferably from about 2500 to 4500 Å.

Hard mask layer 14 is formed over oxide layer 12 to a thickness of preferably from about 300 to 2000 Å, and more preferably from about 300 to 800 Å. Hard mask layer 14 is preferably formed of polysilicon.

Hard mask layer 14 is patterned to expose oxide layer 12 within active areas 16. Hard mask layer 14 may be patterned by, for example, forming a patterned photoresist layer 17 over hard mask layer 14 as shown in FIG. 1, exposing hard mask 14 within, and defining, active areas 16. Hard mask 14 is then etched, exposing oxide layer 12 within active areas 16 and the patterned photoresist layer 17 is removed.

Active areas 16 are each preferably from about 0.05 μm to 50 μm wide, and more preferably from about 0.05 to 30 μm wide [size of typical active layer mask].

Adjacent active areas 16 define inverted staircase STI region 20 therebetween. Semiconductor devices 22, 23 will be formed within active areas 16 and electrically isolated by inverted staircase STI region 20 (see FIG. 9).

Formation of First Step Trench 18

Figure 2:
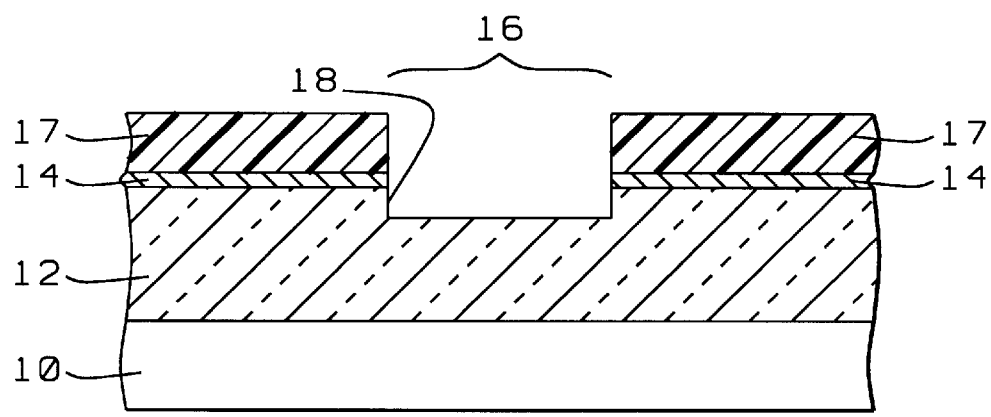

As shown in FIG. 2, oxide layer 12 is etched to a depth of from about 500 to 1500 Å within active area 16 to form first step trench 18.

Formation of First Spacers 26

Figure 3:
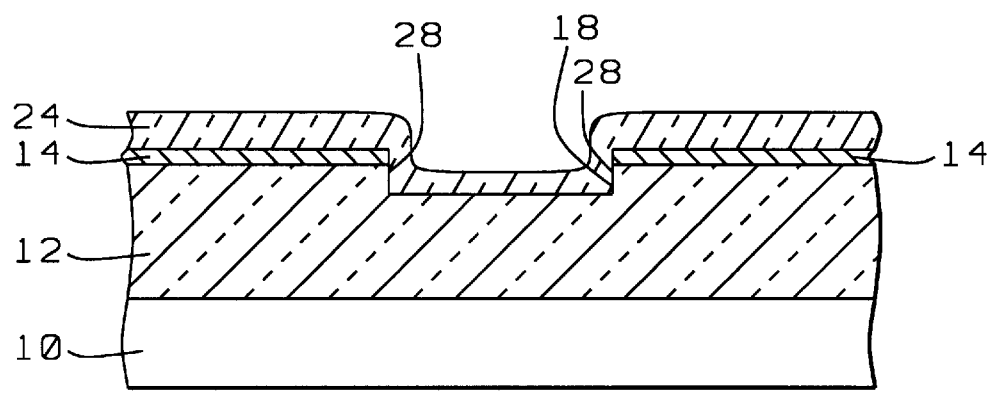

As shown in FIG. 3, first spacer layer 24 is formed over the structure, partially filling trench 18. Spacer layer 24 is preferably comprised of $Si_3N_4$ or SiON deposited by LPCVD or PECVD using precursors $SiH_2Cl_2/SiH_4$ and BTBAS (bis(tertiary-butylamino) silane) with $NH_3$. Spacer layer 24 is more preferably comprised of $Si_3N_4$ (SiN) as will be used for illustrative purposes hereafter for each of the successive spacer layers 32, 40, (and others as desired).

First SiN spacer layer 24 is deposited to a thickness of from preferably about 100 to 1000 Å, and more preferably from about 100 to 350 Å.

Figure 4:
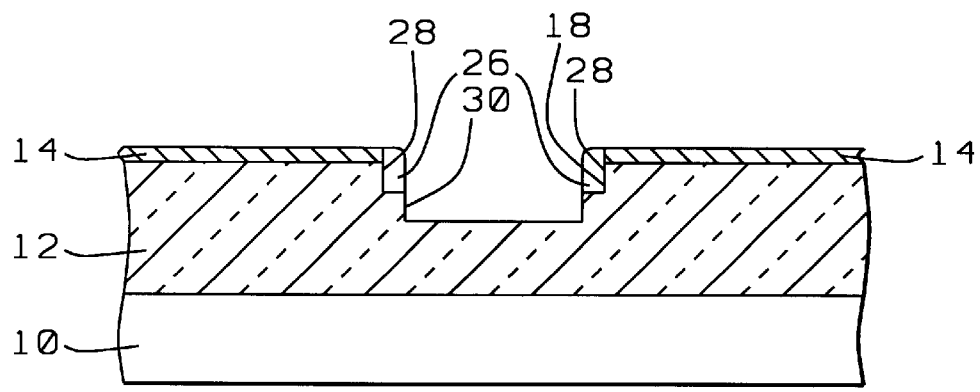

As shown in FIG. 4, first SiN spacer layer 24 is then isotropically etched to form first SiN spacers 26 on the sidewalls 28 of first trench/first step 18.

First SiN spacers 26 are preferably from about 80 to 1200 Å wide, and more preferably from about 80 to 600 Å wide.

Formation of Second Step Trench 30

As shown in FIG. 4, oxide layer 12 is then etched a second time to a depth of from about 500 to 1500 Å within active areas 16, using first SiN spacers 26 and patterned polysilicon hard mask layer 14 as masks, to form second step trench 30.

Formation of Second Spacer 34

Figure 5:
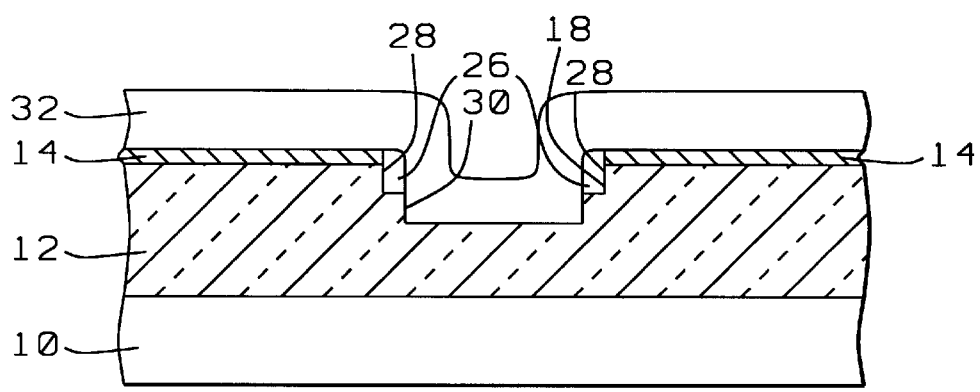

As shown in FIG. 5, second SiN spacer layer 32 is formed over the structure of FIG. 4 by the same method as the first SiN spacer layer 24 is formed.

Second SiN spacer layer 32 is deposited to a thickness of from preferably about 100 to 1000 Å, and more preferably from about 100 to 350 Å.

Figure 6:
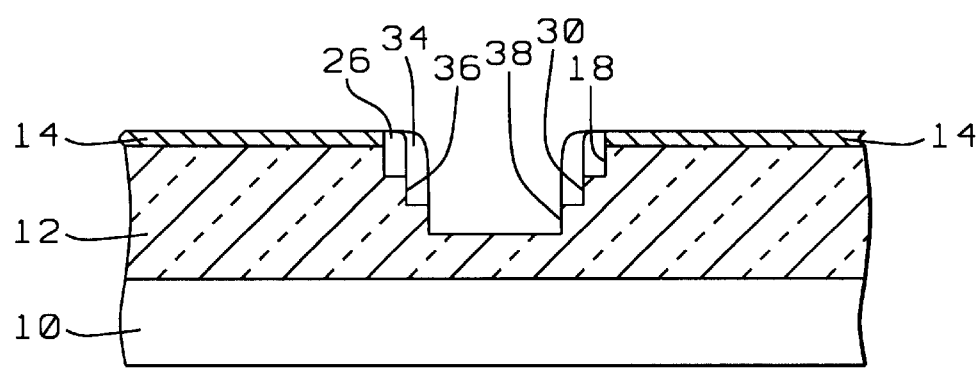

As shown in FIG. 6, second SiN spacer layer 32 is then isotropically etched to form second SiN spacers 34 on the sidewalls 36 of second trench/second step 30 and on first SiN spacers 26. Second SiN spacers 34 are preferably from about 80 to 1200 Å wide, and more preferably from about 80 to 600 Å wide.

Formation of Third Step Trench 38

As shown in FIG. 6, oxide layer 12 is then etched a third time to a depth of from about 500 to 1500 Å within active areas 16, using first SiN spacers 26, second SiN spacers 32, and patterned polysilicon hard mask layer 14 as masks, to form third step trench 38.

Formation of Third Spacer 42

Figure 7:
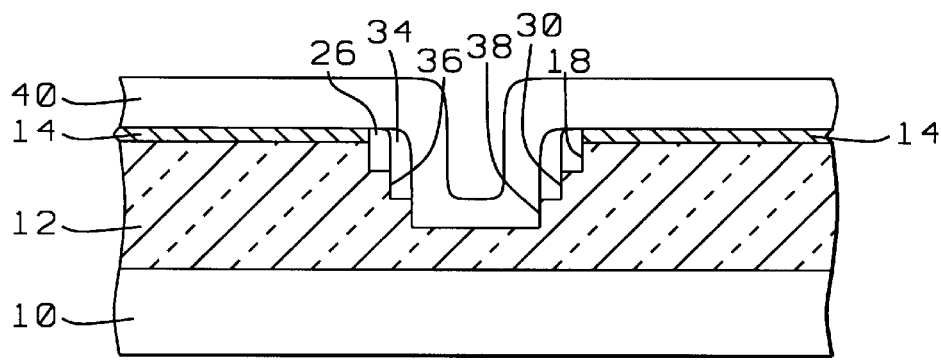

As shown in FIG. 7, third SiN spacer layer 40 is formed over the structure of FIG. 6 by the same method as the first and second SiN spacer layers 24, 32 are formed.

Third SiN spacer layer 40 is deposited to a thickness of from preferably about 100 to 1000 Å and more preferably from about 100 to 350 Å.

Figure 8:
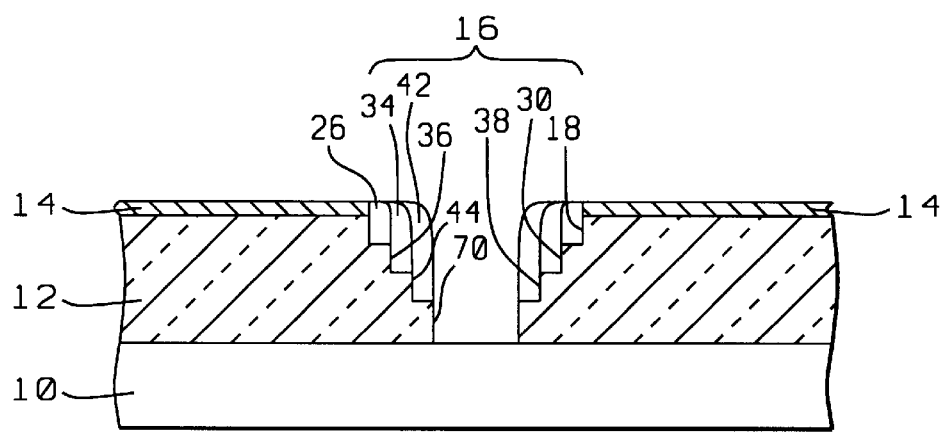

As shown in FIG. 8, third SiN spacer layer 40 is then isotropically etched to form third SiN spacers 42 on the sidewalls 44 of third trench/third step 38, and on second SiN spacers 34. Third SiN spacers 42 are preferably from about 80 to 1200 Å wide, and more preferably from about 80 to 600 Å wide.

Although for illustrative purposes, three trenches/steps 18, 30, 39 have been fabricated, fewer trenches/steps or more trenches/steps may be formed. Preferably, from two to five trenches/steps are formed.

Formation of Final Step Trench 70

As shown in FIG. 8, final step trench 70 is formed through the remainder of oxide layer 12 within active area 16 to expose substrate 10 using first, second, and third SiN spacers 26, 34, 42 (and any other SiN spacers formed) and patterned polysilicon hard mask layer 14 as masks.

Removal of SiN Spacers 26, 34, 42 and Patterned Hard Mask Layer 14

Figure 9:
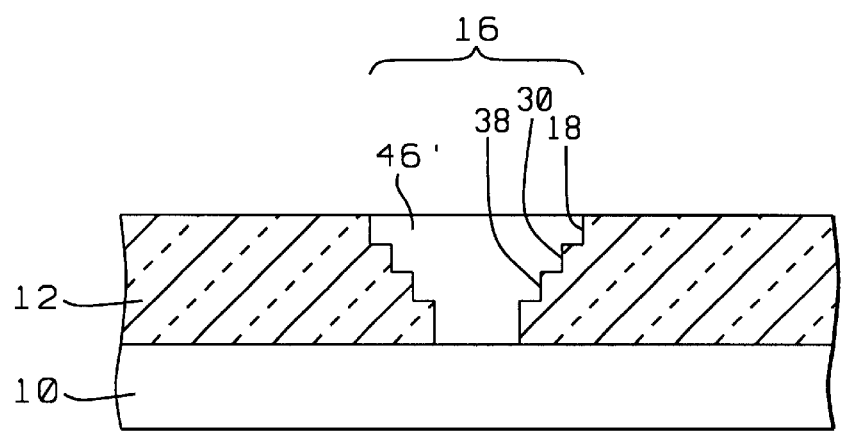

As shown in FIG. 9, first, second, and third SiN spacers 26, 34, 42 and patterned hard mask layer 14 are removed from the structure of FIG. 8, exposing first, second, and third trenches/steps 18, 30, 38 and their respective sidewalls 28, 36, 44.

Formation of Active Area Silicon Structures 46'

As shown in FIG. 9, silicon layer 46 is selectively deposited over the structure, filling first, second, third trenches and final/steps 18, 30, 38, 70 and planarized to form planarized active area silicon structures 46' contacting substrate 10 and within active areas 16. Silicon layer 46 is preferably formed from epitaxial silicon (epi).

Formation of Semiconductor Devices 22, 23 over Active Area Epi Structures 46'

Figure 10:
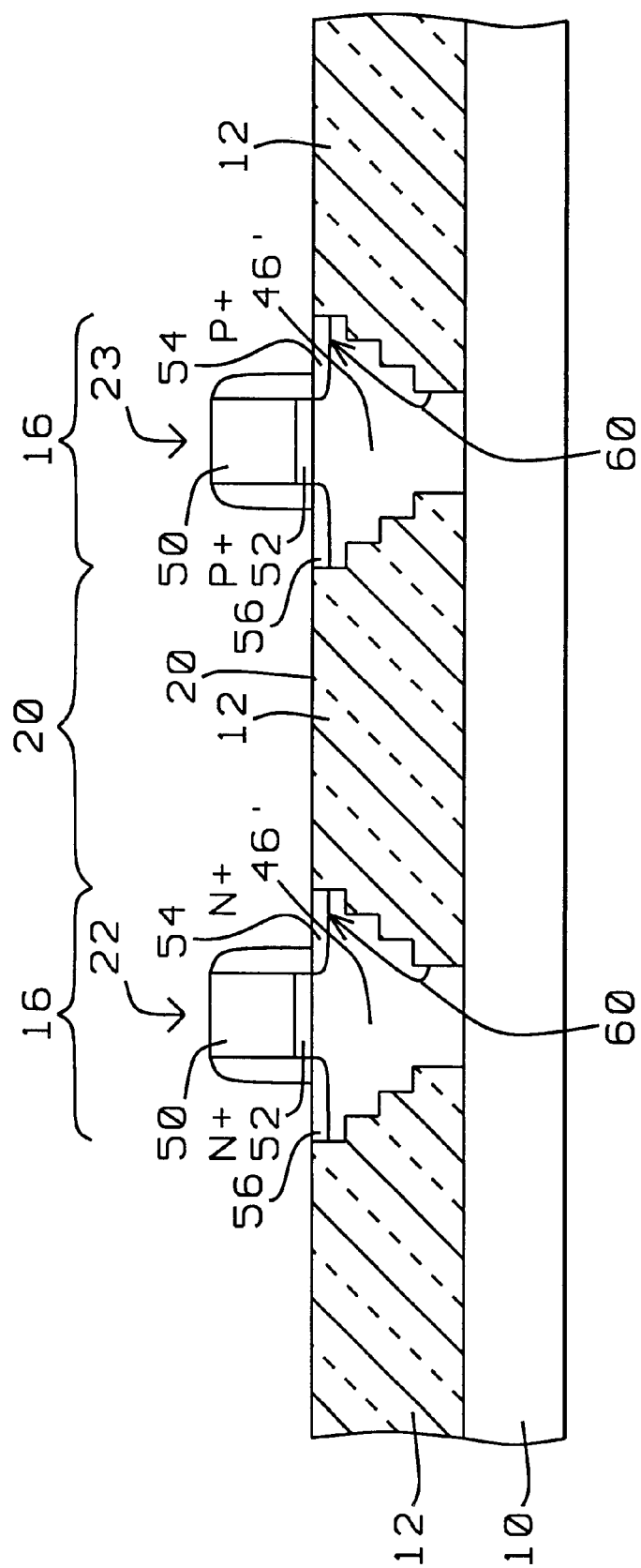

As shown in FIG. 10, conventional processes may be used to form semiconductor devices 22, 23 over active area epi structures 46' within active areas 16. Semiconductor devices 22, 23 including, for example: gate electrodes 50 with underlying gate dielectric layers 52; and S/D areas 54, 56. For example, as shown in FIG. 10, device 22 may be an N metal-oxide semiconductor (NMOS) with $N^+$ doped S/D areas 54, 56 and device 22 may be a P metal-oxide semiconductor (PMOS) with $P^+$ doped S/D areas 54, 56. It is noted that adjacent devices 22, 23 may both be either NMOS or PMOS devices.

The intervening inverted staircase shaped STI region 20 between adjacent semiconductor devices 22, 23 formed over staircase shaped active area epi structures 46' serve to electrically isolate adjacent semiconductor devices 22, 23. The inverted staircase structure of the active area epi structures 46' increases the path between the NMOS $n^+$S/D area of one semiconductor device 22 and the PMOS $p^+$S/D area of the adjacent semiconductor device 23. This would also be the case for two adjacent NMOS or PMOS devices.

This beneficially improves the latchup immunity. This path length may be modified by formation of fewer or greater number of trenches/steps, and is a function of the height and width of the trenches/steps so formed, for example.

By fabricating the sloped, stepped staircase active area epi structures 46' of the present invention, the basewidth 60 between the $n^+$S/D area of one semiconductor device 22 and the $p^+$S/D area of the adjacent semiconductor device 23 is effectively extended which improves latchup immunity for the chips employing the method of the present invention. This reduces system failure and the requirement to power down.

While particular embodiments of the present invention have been illustrated and described, it is not intended to limit the invention, except as defined by the following claims.

We claim:

1. A method of forming an inverted staircase shaped STI structure, comprising the steps of:

a) providing a semiconductor substrate having an overlying oxide layer; said substrate having at least a pair of active areas defining an STI region therebetween;

b) etching said oxide layer a first time within said active areas to form first step trenches; said first step trenches having exposed sidewalls;

c) forming continuous side wall spacers on said exposed first step trench sidewalls;

d) etching said oxide layer 1 or more successive times using the previously formed step side wall spacers as masks to form successive step trenches within said active areas; each said successive step trenches having exposed sidewalls and having side wall spacers successively formed on said successive step trench exposed sidewalls;

e) etching said oxide layer a final time using the previously formed step side wall spacers as masks to form final step trenches exposing said substrate within said active areas; said STI region comprising an inverted staircase shaped STI structure;

f) removing all of said step side wall spacers from said step trenches; and g) forming planarized active area silicon structures within said final step trenches and forming semiconductor deveices thereon.

2. The method of claim 1, wherein said active areas have a width of from about 0.05 to 50 µm; said first step trench has a depth below said semiconductor substrate of from about 500 to 150 Å; said successive step trenches have a depth below the respective previous step trench of from about 500 to 1500 Å.

3. The method of claim 1, wherein said oxide layer is from about 1000 to 8000 Å thick, said side wall spacers are from about 80 to 1200 Å wide and are formed of $Si_3N_4$; and said active area silicon structure is formed of epitaxial silicon.

4. The method of claim 1, wherein said oxide layer is from about 2500 to 4500 Å thick, said side wall spacers are from about 80 to 600 Å wide and are formed of $Si_3N_4$; and said active area silicon structure is formed of epitaxial silicon.

5. The method of claim 1, wherein said oxide layer includes an overlying patterned hard mask exposing said oxide layer within said active areas.

6. The method of claim 1, wherein said oxide layer includes an overlying patterned polysilicon hard mask exposing said oxide layer within said active areas.

7. The method of claim 1, wherein the semiconductor devices are formed on the upper surface of said planarized active area silicon structures.

8. A method of forming an inverted staircase shaped STI structure, comprising the steps of:
   a) providing a semiconductor substrate having an overlying oxide layer; said oxide layer having an overlying patterned hard mask layer defining at least a pair of active areas; said active areas defining an STI region therebetween;
   b) etching said oxide layer through said patterned hard mask a first time within said active areas to form first step trenches; said first step trenches having exposed sidewalls;
   c) forming continuous side wall spacers on said exposed first step trench sidewalls;
   d) etching said oxide layer 1 or more successive times using said patterned hard mask and the previously formed step side wall spacers as masks to form successive step trenches within said active areas; each said successive step trenches having exposed sidewalls and having side wall spacers successively formed on said successive step trench exposed sidewalls;
   e) etching said oxide layer a final time using said patterned hard mask and the previously formed step side wall spacers as masks to form final step trenches exposing said substrate within said active areas; said STI region comprising an inverted staircase shaped STI structure;
   f) removing said patterned hard mask and all of said step side wall spacers, from said step trenches; and
   g) forming planarized active area silicon structures within said final step trenches and forming semiconductor devives thereon.

9. The method of claim 8, wherein said active areas have a width of from about 0.05 to 50 $\mu$m; said first step trench has a depth below said semiconductor substrate of from about 500 to 1500 Å; said successive step trenches have a depth below the respective previous step trench of from about 500 to 1500 Å.

10. The method of claim 8, wherein said oxide layer is from about 1000 to 8000 Å thick; said patterned hard mask is from about 300 to 2000 Å thick and is formed of polysilicon; said side wall spacers are from about 80 to 1200 Å wide and are formed of $Si_3N_4$; and said active area silicon structure is formed of epitaxial silicon.

11. The method of claim 8, wherein the said oxide layer is from about 2500 to 4500 Å thick; said patterned hard mask is from about 300 to 800 Å thick and is formed of polysilicon; said side wall spacers are from about 80 to 600 Å wide and are formed of $Si_3N_4$; and said active area silicon structure is formed of epitaxial silicon.

12. The method of claim 8 wherein the semiconductor devices are formed on the upper surface of said planarized active area silicon structures.

13. A method of forming an inverted staircase shaped STI structure, comprising the steps of:
   a) providing a semiconductor substrate having an overlying oxide layer; said oxide layer having an overlying patterned polysilicon hard mask layer defining at least a pair of active areas; said active areas defining an STI region therebetween;
   b) etching said oxide layer through said patterned polysilicon hard mask a first time within said active areas to form first step trenches; said first step trenches having exposed sidewalls;
   c) forming continuous $Si_3N_4$ side wall spacers on said exposed first step trench sidewalls;
   d) etching said oxide layer 1 or more successive times using said patterned polysilicon hard mask and the previously formed step $Si_3N_4$ side wall spacers as masks to form successive step trenches within said active areas; each said successive step trenches having exposed sidewalls and having $Si_3N_4$ side wall spacers successively formed on said successive step trench exposed sidewalls;
   e) etching said oxide layer a final time using said patterned polysilicon hard mask and the previously formed step $Si_3N_4$ side wall spacers as masks to form final step trenches exposing said substrate within said active areas; said STI region comprising an inverted staircase shaped STI structure;
   f) removing said patterned polysilicon hard mask and all of said $Si_3N_4$ step side wall spacers from said step trenches; and
   g) forming planarized active area silicon structures within said and final step trenches and forming semiconductor devices thereon.

14. The method of claim 13, wherein said active areas have a width of from about 0.05 to 50 $\mu$m; said first step trench has a depth below said semiconductor substrate of from about 500 to 1500 Å; said successive step trenches have a depth below the respective previous step trench of from about 500 to 1500 Å.

15. The method of claim 13, wherein said oxide layer is from about 1000 to 8000 Å thick; said patterned polysilicon hard mask is from about 300 to 2000 Å thick; said $Si_3N_4$ side wall spacers are from about 80 to 1200 Å wide; and said active area silicon structure is formed of epitaxial silicon.

16. The method of claim 13, wherein said oxide layer is from about 2500 to 4500 Å thick; said patterned polysilicon hard mask is from about 300 to 800 Å thick; said $Si_3N_4$ side wall spacers are from about 80 to 600 Å wide; and said active area silicon structure is formed of epitaxial silicon.

17. The method of claim 13, wherein the semiconductor devices are formed on the upper surface of said planarized active area silicon structures.

18. A method of forming an inverted staircase shaped STI structure, comprising the steps of:
   a) providing a semiconductor substrate having an overlying oxide layer; said oxide layer having an overlying patterned polysilicon hard mask layer defining at least a pair of active areas; said active areas defining an STI region therebetween; said active areas have a width of from about 0.05 to 50 $\mu$m;
   b) etching said oxide layer through said patterned polysilicon hard mask a first time within said active areas to form first step trenches; said first step trenches having exposed sidewalls; said first step trench having a depth below said semiconductor substrate of from about 500 to 1500 Å;

c) forming continuous $Si_3N_4$ side wall spacers on said exposed first step trench sidewalls;

d) etching said oxide layer 1 or more successive times using said patterned polysilicon hard mask and the previously formed step $Si_3N_4$ side wall spacers as masks to form successive step trenches within said active areas; each said successive step trenches having exposed sidewalls and having $Si_3N_4$ side wall spacers successively formed on said successive step trench exposed sidewalls;

e) etching said oxide layer a final time using said patterned polysilicon hard mask and the previously formed step $Si_3N_4$ side wall spacers as masks to form final step trenches exposing said substrate within said active areas; said STI region comprising an inverted staircase shaped STI structure; said successive step trenches having a depth below the respective previous step trench of from about 500 to 1500 Å;

f) removing said patterned polysilicon hard mask and all of said $Si_3N_4$ step side wall spacers from said step trenches; and g) forming planarized active area silicon structures within said final step trenches.

19. The method of claim 18, wherein said oxide layer is from about 1000 to 8000 Å thick; said patterned polysilicon hard mask is from about 300 to 2000 Å thick; said $Si_3N_4$ side wall spacers are from about 80 to 1200 Å wide; and said active area silicon structure is formed of epitaxial silicon.

20. The method of claim 18 wherein said oxide layer is from about 2500 to 4500 Å thick; said patterned polysilicon hard mask is from about 300 to 800 Å thick; said $Si_3N_4$ side wall spacers are from about 80 to 600 Å wide; and said active area silicon structure is formed of epitaxial silicon.

21. The method of claim 18, wherein the semiconductor devices are formed on the upper surface of said planarized active area silicon structures.

* * * * *